United States Patent [19]

Lee

[11] Patent Number: 5,650,771
[45] Date of Patent: Jul. 22, 1997

[54] ELECTRICAL SOCKET WITH MONITORING UNIT FOR MONITORING OPERATING CONDITIONS

[76] Inventor: Chung-Cheng Lee, No. 16, Shing-Gong Rd., Yung-Kang City, Tainan Hsien, Taiwan

[21] Appl. No.: 427,766

[22] Filed: Apr. 25, 1995

[51] Int. Cl.[6] .................................................. G08B 21/00
[52] U.S. Cl. ..................... 340/656; 340/635; 340/310.08; 364/483; 360/42
[58] Field of Search ........................... 340/635, 656, 340/310.08, 538, 657, 660, 664; 364/483, 482, 550; 361/42

[56] References Cited

U.S. PATENT DOCUMENTS

| | | | |
|---|---|---|---|
| 4,644,320 | 2/1987 | Corr et al. | 340/310.08 |
| 5,003,486 | 3/1991 | Herdel et al. | 340/656 |
| 5,160,926 | 11/1992 | Schweitzer, III | 340/538 |
| 5,332,993 | 7/1994 | Ninomiya | 340/636 |
| 5,448,491 | 9/1995 | Janke et al. | 340/635 |

Primary Examiner—Jeffery Hofsass
Assistant Examiner—Edward Lefkowitz
Attorney, Agent, or Firm—Skjerven, Morrill, MacPherson, Franklin and Friel; Alan H. MacPherson

[57] ABSTRACT

An electrical socket includes at least one socket receptacle adapted to connect electrically an electrical appliance to a line power source, and a monitoring unit connected electrically across the socket receptacle for monitoring operating conditions, such as the ambient temperature, the line voltage, the line current and the line power supplied by the line power source, of the electrical socket.

3 Claims, 5 Drawing Sheets

ELECTRICAL SOCKET WITH MONITORING UNIT FOR MONITORING OPERATING CONDITIONS

BACKGROUND OF THE INVENTION

1. Field of the Invention

The invention relates to an electrical socket for connecting electrically an electrical appliance to a line power source, more particularly to an electrical socket with a monitoring unit for monitoring operating conditions of the electrical socket.

2. Description of the Related Art

Short circuiting is a possible source of fire and usually arises when wearing of electrical cables occurs. Known electrical cables include a protective insulator layer that is wrapped around a conductor. The size of an electrical cable that is in use depends on the amount of voltage and current to be transmitted thereby. At high voltages and currents, an electrical cable must be capable of enduring relatively high operating temperatures. After a period of use, the insulator layer of the electrical cable deteriorates and eventually fails to provide adequate protection against short circuiting. Thus, frequent replacement of electrical cables is needed to minimize the possibility of short circuiting due to wearing of the electrical cables.

Short circuiting also arises when electrical cables are used improperly, i.e. overloading. Electrical cables are designed to bear a maximum operating voltage and a maximum operating current. However, in actual use, overloading happens when the current passing through the electrical cables exceeds the specified maximum value due to the use of electrical extensions for connecting a plurality of electrical appliances to a single electrical socket. Overloading damages the fuses which are installed in the electrical appliances and causes overheating and short circuiting of the electrical cables.

SUMMARY OF THE INVENTION

Therefore, the object of the present invention is to provide an electrical socket with a monitoring unit that is capable of monitoring operating conditions of the electrical socket and that can be used to alert the user in the event that a preset overload condition has been detected to help avert actual occurrence of an overload.

Accordingly, the electrical socket of the present invention comprises at least one socket receptacle adapted to connect electrically an electrical appliance to a line power source, a monitoring unit connected electrically across the socket receptacle for monitoring operating conditions of the electrical socket, and a display unit connected electrically to the monitoring unit and controlled by the monitoring unit so as to display operating conditions of the electrical socket thereon.

The operating conditions monitored by the monitoring unit include the ambient temperature, the line voltage and the line current. The monitoring unit includes a temperature sensor for sensing the ambient temperature, and a processing unit connected electrically to and receiving ambient temperature data from the temperature sensor. The processing unit is further connected electrically to the socket receptacle and receives line voltage data and line current data therefrom. The monitoring unit further includes a memory unit connected electrically to the processing unit and storing maximum operating-temperature data, maximum operating-voltage data and maximum operating-current data therein. The processing unit compares the ambient temperature data with the maximum operating-temperature data, the line voltage data with the maximum operating-voltage data, and the line current data with the maximum operating-current data to detect presence of a preset overload condition.

The operating conditions may further include the line power supplied by the line power source. The processing unit computes the line power by multiplying the line voltage data with the line current data. The memory unit further stores maximum operating-power data therein, and the processing unit compares the line power computed thereby with the maximum operating-power data to detect the presence of the preset overload condition.

The monitoring unit further includes an alarm unit connected electrically to and activated by the processing unit upon detection of the overload condition, and function key means connected electrically to the processing unit and operable so as to control the processing unit to store the maximum operating-temperature data, the maximum operating-voltage data, the maximum operating-current data and the maximum operating-power data in the memory unit.

BRIEF DESCRIPTION OF THE DRAWINGS

Other features and advantages of the present invention will become apparent in the following detailed description of the preferred embodiments, with reference to the accompanying drawings, of which.

DETAILED DESCRIPTION OF THE PREFERRED EMBODIMENTS

Figure 1:
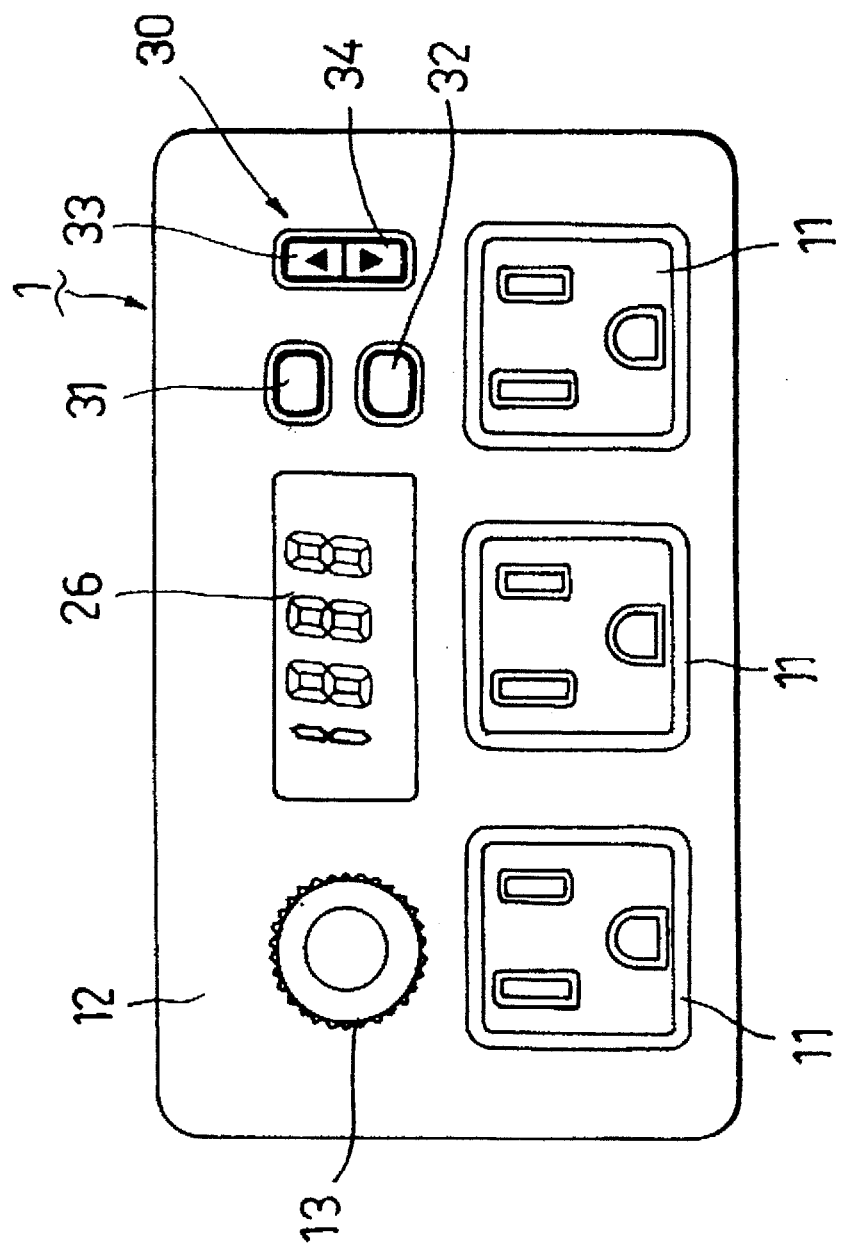
FIG. 1 is a schematic view of the first preferred embodiment of an electrical socket according to the present invention.

Referring to the FIG. 1, the first preferred embodiment of an electrical socket according to the present invention is shown to comprise a housing 1 with a face plate 12 and at least one socket receptacle 11 mounted on the face plate 12. In this embodiment, there are three socket receptacles 11 mounted on the face plate 12. Each of the socket receptacles 11 serves to connect electrically an electrical appliance to a line power source. The socket receptacles 11 are conventional in construction and will not be detailed herein. The face plate 12 further has a fuse unit 13, a display unit 26 and a function key set 30 mounted thereon. The function key set 30 includes four function keys 31, 32, 33, 34, the purposes of which will be described in the succeeding paragraphs.

Figure 2:
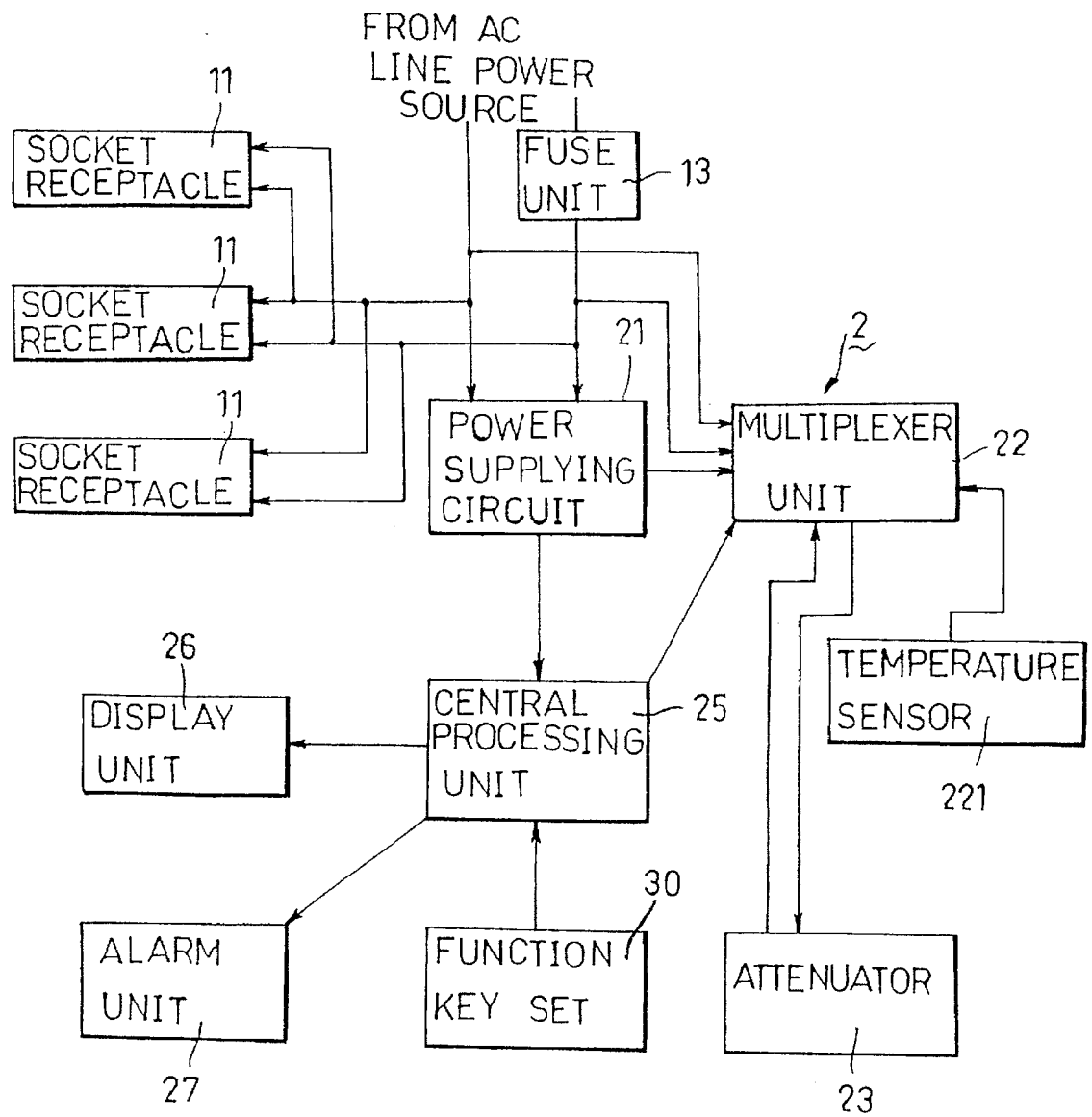
FIG. 2 is a schematic circuit block diagram of the first preferred embodiment.
Figure 3:
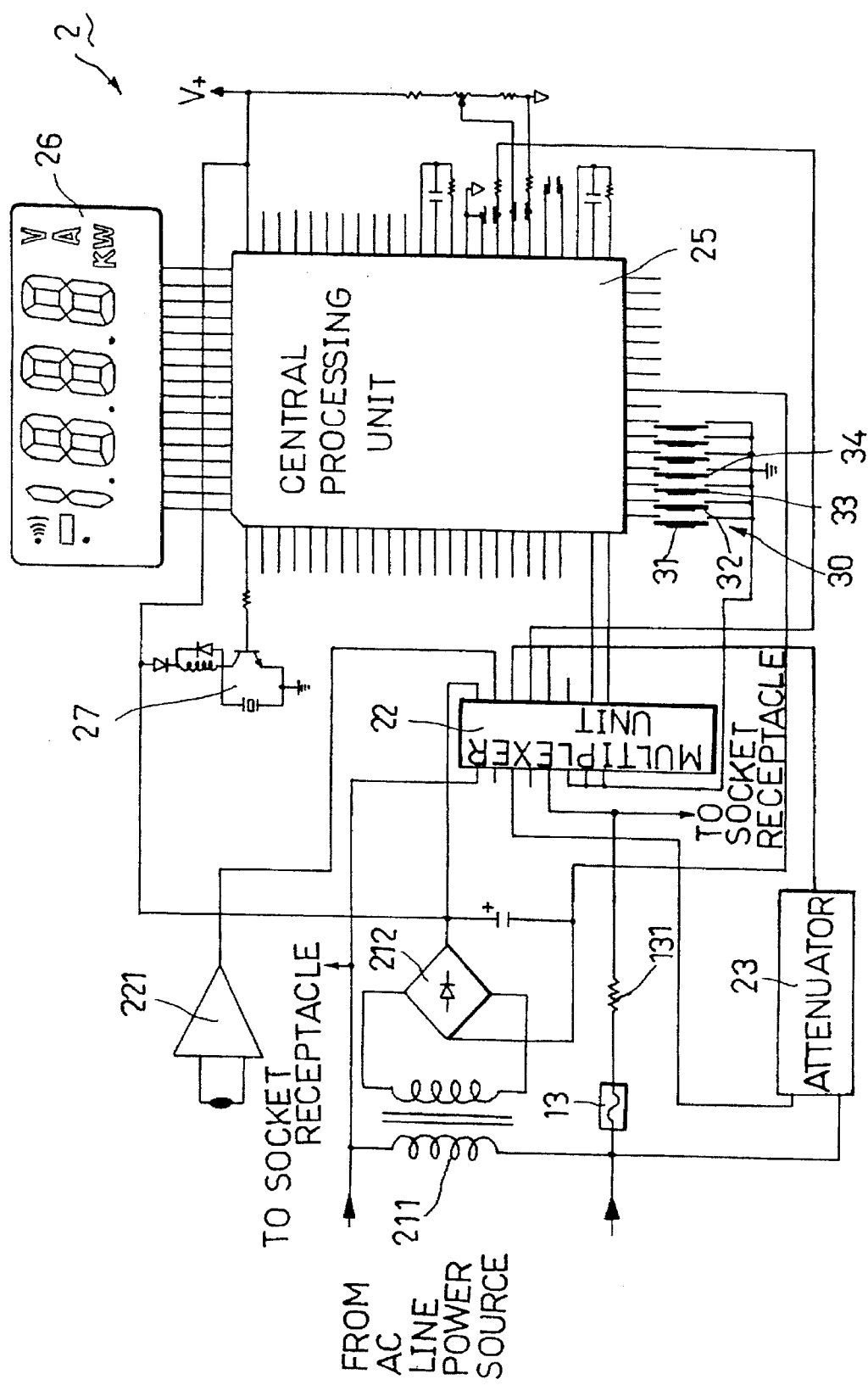
FIG. 3 is a schematic electrical circuit diagram of the first preferred embodiment.

Referring to FIGS. 2 and 3, the electrical socket further comprises a monitoring unit 2 disposed in the housing 1. The monitoring unit 2 is connected electrically across the socket receptacles 11 and serves to monitor the operating conditions, such as the ambient temperature, the line voltage, the line current and the line power supplied by the line power source, of the electrical socket. The monitoring unit 2 includes a power supplying circuit 21, a multiplexer unit 22, a temperature sensor 221, an attenuator 23, a central processing unit 25 and an alarm unit 27.

The power supplying circuit 21 includes a transformer 211 and a bridge rectifier circuit 212 for converting an AC power signal from the line power source into a DC power signal for the monitoring unit 2. The socket receptacles 11 are connected in parallel across an input winding of the transformer 211. The fuse unit 13 is connected in series to the input winding of the transformer 211 to prevent the flow of an excessive amount of current to the transformer 211.

The temperature sensor 221 senses the ambient temperature and generates an electrical signal corresponding thereto. The multiplexer unit 22 is preferably a differential 4-channel multiplexer-demultiplexer integrated circuit, such as CD4052B by RCA. The multiplexer unit 22 has signal inputs which are connected electrically to the temperature sensor 221, the input windings of the transformer 211 and the attenuator 23, signal outputs which are connected electrically to the attenuator 23 and the central processing unit 25, and control inputs which are connected electrically to the central processing unit 25.

The central processing unit 25 receives operating condition data, such as the ambient temperature, the line voltage and the line current, from the multiplexer unit 22 and monitors the operating conditions of the electrical socket to detect the presence of a preset overload condition. When monitoring the ambient temperature, the central processing unit 25 controls the multiplexer unit 22 to provide the output of the temperature sensor 221 thereto so as to receive ambient temperature data therefrom. When monitoring the line voltage, the central processing unit 25 controls the multiplexer unit 22 to connect the attenuator 23 to the input windings of the transformer 211. Line voltage data generated by the attenuator 23 is then received by the central processing unit 25 via the multiplexer unit 22. When monitoring the line current, the central processing unit 25 controls the multiplexer unit 22 to connect the attenuator 23 to a resistor 131 that is in series with the fuse unit 13 so that the attenuator 23 is able to detect a voltage drop across the resistor 131 due to the flow of the line current therethrough. Line current data that is generated by the attenuator 23 is then received by the central processing unit 25 via the multiplexer unit 22. When monitoring the line power supplied by the line power source, the central processing unit 25 simply multiplies the line voltage data with the line current data to obtain the line power.

The display unit 26, which is preferably a liquid crystal display (LCD), is connected electrically to the central processing unit 25 and is controlled by the latter so as to show the value of the line voltage, the line current, the ambient temperature or the line power thereon.

The alarm unit 27 is preferably a buzzer which is connected electrically to the central processing unit 25 and which is activated by the latter upon detection that the line voltage, the line current, the ambient temperature or the line power has exceeded preset limits.

Figure 4:
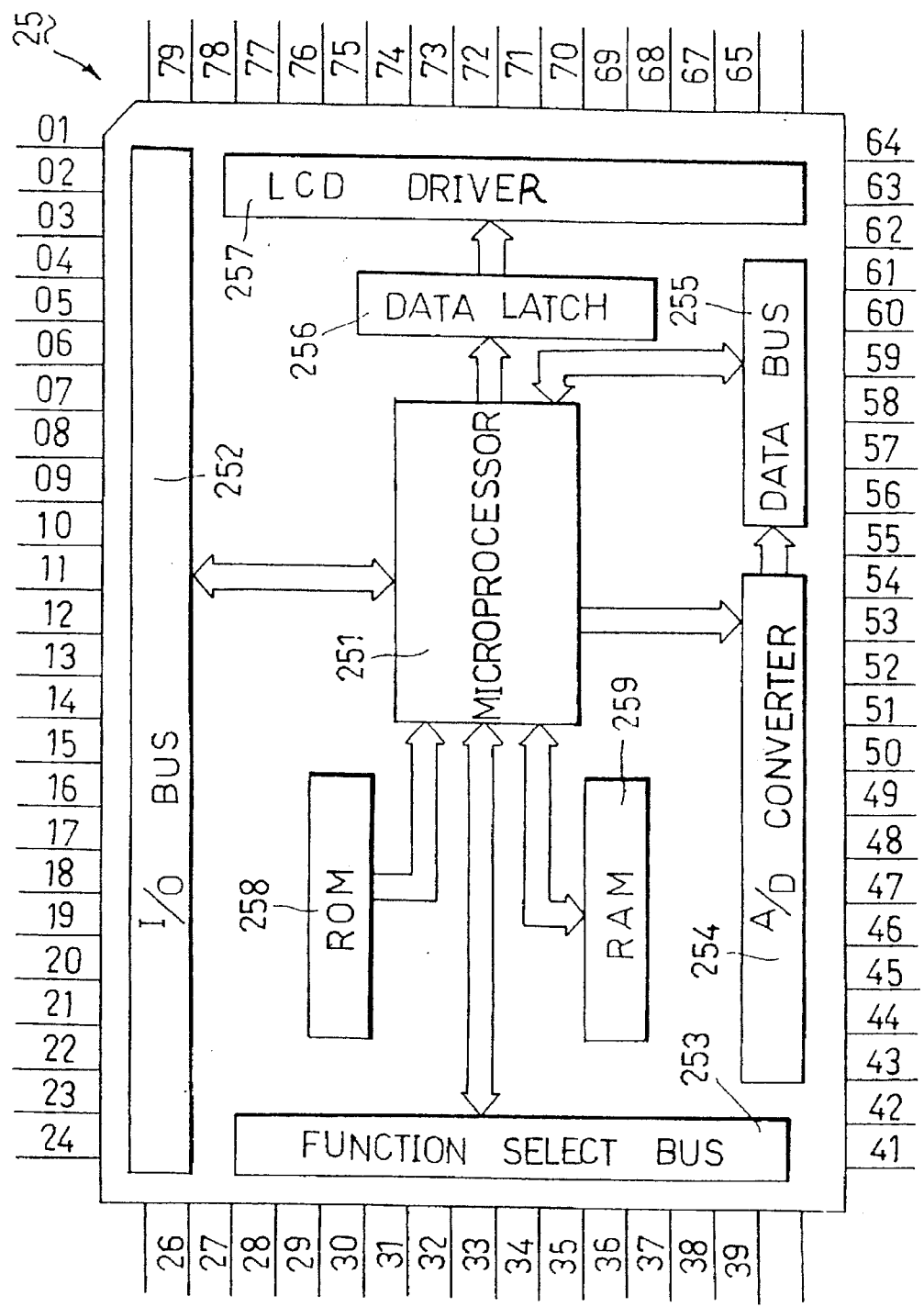
FIG. 4 is a schematic circuit block diagram of a central processing unit of the first preferred embodiment.

Referring to FIG. 4, the central processing unit 25 is a programmable integrated circuit which comprises a microprocessor 251, an input/output (I/O) bus 252, a function select bus 253, an analog-to-digital (A/D) converter 254, a data bus 255, a data latch 256, a display driver 257, a read-only memory (ROM) 258 and a random-access memory (RAM) 259. The alarm unit 27 and the control inputs of the multiplexer unit 22 are connected electrically to the microprocessor 251 via the I/O bus 252. The function key set 30 is connected electrically to the microprocessor 251 via the function select bus 253. The signal outputs of the multiplexer unit 22 are connected electrically to the microprocessor 251 via the A/D converter 254 and the data bus 255. The A/D converter 254 converts analog data from the multiplexer unit 22 into digital data for processing by the microprocessor 251. The display unit 26 is connected electrically to the microprocessor 251 via the data latch 256 and the display driver 257. The ROM 258 is used to store manufacturer-specified operating data, such as the maximum line voltage, the maximum line current, the maximum ambient temperature and the maximum line power, for the electrical socket therein. The RAM 259 is used to store user-specified operating data, such as the maximum line voltage, the maximum line current, the maximum ambient temperature and the maximum like power, for the electrical socket therein.

The function key 31 serves as a select key for controlling the central processing unit 25 to control, in turn, the display unit 26 to show the value of a selected one of the line voltage, the line current, the ambient temperature and the line power thereon. The function key 32 serves as a setting key which is used in combination with the increment function key 33 and the decrement function key 34 to control the microprocessor 251 to store the user-specified operating data in the RAM 259.

The microprocessor 251 refers to the user-specified operating data in the RAM 259 to detect the presence of the preset overload condition, and refers to the manufacturer-specified operating data in the ROM 258 if the user-specified operating data has yet to be set by the user. The microprocessor 251 does not permit setting of the user-specified operating data to values greater than those of the manufacturer-specified operating data.

Figure 5:
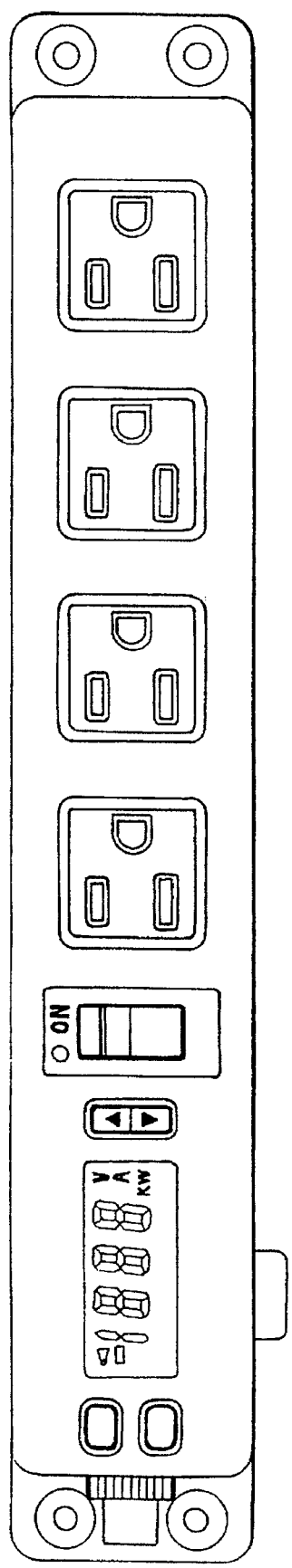
FIG. 5 is a schematic view of the second preferred embodiment of an electrical socket according to the present invention.

In use, the housing 1 of the electrical socket may be mounted on a wall of a building structure. Alternatively, the electrical socket of the present invention may be modified so as to be in the form of an electrical extension, as shown in FIG. 5. The construction and operation of the embodiment shown in FIG. 5 are substantially similar to those of the previous embodiment and will not be detailed further.

Initially, the display unit 26 shows the value of the line voltage thereon. The function key 31 is operated if the user wishes to see the value of the line current, the ambient temperature or the line power. The function keys 32, 33, 34 are operated to set user-specified operating data in the RAM 259. Upon detection by the central processing unit 25 of the presence of the preset overload condition, that is, when any of the line voltage, the line current, the ambient temperature and the line power exceeds the user-specified or the manufacturer-specified operating data, the central processing unit 25 activates the alarm unit 27 to alert the user. Of course, if the line current exceeds that specified by the manufacturer, the fuse unit 13 breaks to prevent the occurrence of a short circuit.

Therefore, it has thus been shown that, unlike the conventional electrical socket which provides inadequate protection against short-circuiting, the electrical socket of the present invention incorporates a monitoring unit that is capable of alerting the user in the event that a preset overload condition has been detected to help avert actual occurrence of an overload. The objective of the present invention is thus attained.

While the present invention has been described in connection with what is considered the most practical and preferred embodiments, it is understood that this invention is not limited to the disclosed embodiments, but is intended to cover various arrangements included within the spirit and scope of the broadest interpretation so as to encompass all such modifications and equivalent arrangements.

I claim:

1. An electrical socket, comprising:

at least one socket receptacle adapted to connect electrically an electrical appliance to a line power source; and a monitoring unit connected electrically across said socket receptacle for monitoring operating conditions of the electrical socket, said monitoring unit further including;

a temperature sensor for sensing the ambient temperature;

a processing unit connected electrically to and receiving ambient temperature data from said temperature sensor;

a memory unit connected electrically to said processing unit and storing maximum operating-temperature data therein, said processing unit comparing said ambient temperature data with said maximum operating-temperature data to detect presence of a preset overload condition;

wherein said operating conditions include ambient temperature, line voltage and line current, said processing unit being connected electrically to said socket receptacle and receiving line voltage data and line current data therefrom;

wherein said memory unit further stores maximum operating-voltage data and maximum operating-current data therein, said processing unit comparing said line voltage data with said maximum operating-current data to detect the presence of the preset overload condition; and wherein said operating conditions further include line power supplied by the line power source, said processing unit computing the line power by multiplying said line voltage data with said line current data, said memory unit further storing maximum operating-power data therein, said processing unit comparing the line power computed thereby with said maximum operating-power data to detect the presence of the preset overload condition.

2. The electrical socket as claimed in claim 1, wherein said monitoring unit further includes an alarm unit connected electrically to and activated by said processing unit upon detecting the presence of the preset overload condition.

3. The electrical socket as claimed in claim 1, wherein said monitoring unit further includes function key means connected electrically to said processing unit and operable so as to control said processing unit to store said maximum operating-temperature data, said maximum operating-voltage data, said maximum operating-current data and said maximum operating-power data in said memory unit.

\* \* \* \* \*